(12) United States Patent
Dai et al.

(10) Patent No.: US 11,296,724 B2
(45) Date of Patent: *Apr. 5, 2022

(54) ENCODING METHOD AND APPARATUS

(71) Applicant: Huawei Technologies Co., Ltd., Shenzhen (CN)

(72) Inventors: Shengchen Dai, Hangzhou (CN); Lingchen Huang, Hangzhou (CN); Gongzheng Zhang, Hangzhou (CN); Yunfei Qiao, Hangzhou (CN); Chen Xu, Hangzhou (CN); Jun Wang, Hangzhou (CN); Rong Li, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,934

(22) Filed: Mar. 6, 2020

(65) Prior Publication Data

US 2020/0212933 A1 Jul. 2, 2020

Related U.S. Application Data

(63) Continuation of application No. PCT/CN2018/103586, filed on Aug. 31, 2018.

(30) Foreign Application Priority Data

Sep. 8, 2017 (CN) .......................... 201710806972.3
Sep. 8, 2017 (CN) .......................... 201710807973.X
(Continued)

(51) Int. Cl.
*H03M 13/09* (2006.01)
*H03M 13/15* (2006.01)
*H04L 1/00* (2006.01)

(52) U.S. Cl.
CPC ......... *H03M 13/09* (2013.01); *H03M 13/157* (2013.01); *H04L 1/0061* (2013.01)

(58) Field of Classification Search
CPC ...................................................... H03M 13/09
(Continued)

(56) References Cited

U.S. PATENT DOCUMENTS 5,390,196 A 2/1995 Cecil et al.
9,645,884 B2 5/2017 King et al.
(Continued)

FOREIGN PATENT DOCUMENTS

CN 101609418 A 12/2009
CN 102694625 A 9/2012
(Continued)

OTHER PUBLICATIONS

"False-alarm rate check for Polar code with CRC," 3GPP TSG RAN WG1 RAN1 Meeting #90, R1-1713704, Prague, Czech, Total 6 pages, 3rd Generation Partnership Project, Valbonne, France (Aug. 21-25, 2017).

(Continued)

*Primary Examiner* — Fritz Alphonse
(74) *Attorney, Agent, or Firm* — Leydig, Voit & Mayer, Ltd.

(57) ABSTRACT

This application provides an encoding method and apparatus in a wireless communications system. The method includes: performing cyclic redundancy check (CRC) encoding on A to-be-encoded information bits based on a CRC polynomial, to obtain a first bit sequence, where the first bit sequence includes L CRC bits and the A information bits; and performing polar encoding on the first bit sequence, where L has a value of one of 3, 4, 5, 8, and 16. Based on an improved CRC polynomial, coding satisfying a false alarm rate (FAR) requirement is implemented.

16 Claims, 7 Drawing Sheets

(30) Foreign Application Priority Data

Sep. 8, 2017 (CN) .......................... 201710807981.4
Sep. 8, 2017 (CN) .......................... 201710808016.9
Sep. 8, 2017 (CN) .......................... 201710808042.1

(58) Field of Classification Search
USPC ................................ 714/781, 778, 783, 779
See application file for complete search history.

(56) References Cited

U.S. PATENT DOCUMENTS

| | | | |
|---|---|---|---|
| 2008/0320370 A1 | 12/2008 | Shinagawa et al. | |
| 2009/0094507 A1* | 4/2009 | Nakase | H03M 13/091 |
| | | | 714/807 |
| 2013/0061118 A1 | 3/2013 | Pi et al. | |
| 2014/0173376 A1 | 6/2014 | Jeong et al. | |
| 2014/0365842 A1 | 12/2014 | Li et al. | |
| 2015/0222295 A1 | 8/2015 | Li et al. | |
| 2015/0340045 A1* | 11/2015 | Hardwick | G10L 19/018 |
| | | | 704/205 |
| 2015/0362984 A1* | 12/2015 | Waters | G06F 1/3215 |
| | | | 713/324 |
| 2016/0079999 A1 | 3/2016 | Shen et al. | |
| 2017/0222754 A1 | 8/2017 | Noh et al. | |
| 2017/0366199 A1 | 12/2017 | Ge et al. | |
| 2018/0034593 A1 | 2/2018 | Xu et al. | |
| 2018/0287738 A1 | 10/2018 | Xu et al. | |

FOREIGN PATENT DOCUMENTS

| | | |
|---|---|---|
| CN | 103138892 A | 6/2013 |
| CN | 103220001 A | 7/2013 |
| CN | 103780329 A | 5/2014 |
| CN | 104219019 A | 12/2014 |
| CN | 105227539 A | 1/2016 |
| CN | 105337696 A | 2/2016 |
| CN | 106817192 A | 6/2017 |
| CN | 106817195 A | 6/2017 |
| CN | 107026656 A | 8/2017 |
| CN | 107040262 A | 8/2017 |
| CN | 107124188 A | 9/2017 |
| CN | 107659381 A | 2/2018 |
| CN | 108234081 A | 6/2018 |
| WO | 2014092502 A1 | 6/2014 |
| WO | 2017054164 A1 | 4/2017 |

OTHER PUBLICATIONS

Samsung, "Design of a Nested Sequence for Polar Codes," 3GPP TSG RAN WG1 #88bis, Spokane, WA, R1-1705425, XP51243555, total 8 pages, 3rd Generation Partnership Project Valbonne, France (Apr. 3-7, 2017).

Huawei, HiSilicon, "CRC polynomial for L1 control information and MIB," 3GPP TSG RAN WG1 NR Ad-Hoc#2, Qingdao, China, R1-1710471, XP51299682, total 3 pages, 3rd Generation Partnership Project Valbonne, France (Jun. 27-30, 2017).

ZTE, "Segmentation of Polar codes for large UCI," 3GPP TSG RAN WG1 Meeting #90, Prague, Czechia, R1-1713237, XP51328050, total 6 pages, 3rd Generation Partnership Project Valbonne, France (Aug. 21-25, 2017).

InterDigital Inc., "On CRC Polynomial for Uplink Polar Code Construction," 3GPP TSG RAN WG1 Meeting NR#3, Nagoya, Japan, R1-1716742, XP51353845, total 9 pages, 3rd Generation Partnership Project Valbonne, France (Sep. 18-21, 2017).

Rivadeneira Erazo, "Early Detection using CRC Precoding and Polar Codes for Low Latency Communications," Electronic Master''s Thesis, Montreal, Ecole de technologie superieure, total 130 pages (Jun. 2017).

"3rd Generation Partnership Project; Technical Specification Group Radio Access Network; NR; Multiplexing and channel coding (Release 15)," 3GPP TS 38.212 V0.0.1, total 23 pages, 3rd Generation Partnership Project Valbonne, France (Jul. 2017).

* cited by examiner

ENCODING METHOD AND APPARATUS

CROSS-REFERENCE TO RELATED APPLICATIONS

This application is a continuation of International Patent Application No. PCT/CN2018/103586, filed on Aug. 31, 2018, which claims priority to Chinese Patent Application No. 201710807981.4, filed on Sep. 8, 2017, Chinese Patent Application No. 201710806972.3, filed on Sep. 8, 2017, Chinese Patent Application No. 201710807973.X, filed on Sep. 8, 2017, Chinese Patent Application No. 201710808016.9, filed on Sep. 8, 2017, and Chinese Patent Application No. 201710808042.1, filed on Sep. 8, 2017. The disclosures of the aforementioned applications are hereby incorporated by reference in their entireties.

TECHNICAL FIELD

This application relates to the field of communications technologies, and in particular, to an encoding method and apparatus.

BACKGROUND

In a communications system, channel coding is usually used to improve reliability of data transmission and ensure quality of communication. Currently, a 5G mobile communications system includes three application scenarios: enhanced mobile broadband (eMBB), ultra-reliable low-latency communications (URLLC), and massive machine-type communications (mMTC), and puts forward new requirements on data communication. A polar code is the first channel coding method that can be strictly proved to "reach" a channel capacity, and can be applicable to 5G communication and a future communications system.

SUMMARY

This application provides an encoding method and apparatus.

According to a first aspect, this application provides an encoding method, including:

performing, by an encoding apparatus, CRC encoding on A to-be-encoded information bits based on a cyclic redundancy check (CRC) polynomial, to obtain a first bit sequence, where the first bit sequence includes L CRC bits and the A to-be-encoded information bits, and L and A are positive integers, where when L=3, the CRC polynomial is $D^3+D^2+1$;

when L=4, the CRC polynomial is any one of the following polynomials:

$D^4+1$;

$D^4+D^3+1$; or $D^4+D^2+1$;

when L=5, the CRC polynomial is any one of the following polynomials:

$D^5+D^4+1$;

$D^5+D^3+1$;

$D^5+D+1$;

$D^5+D^4+D^3+D+1$;

$D^5+D^4+D^2+D+1$; or $D^5+D^3+D^2+D+1$;

when L=8, the CRC polynomial is any one of the following polynomials:

$D^8+D^6+D^5+D^3+1$;

$D^8+D^7+D^6+D^5+D^3+D^2+1$;

$D^8+D^5+D^4+D+1$;

$D^8+D^7+D^2+D+1$; or $D^8+D^7+D^6+D^5+D^2+D+1$; or when L=16, the CRC polynomial is any one of the following polynomials:

$D^{16}+D^{15}+D^{14}+D^{13}+D^{12}+D^{11}+D^8+D^7+D^6+D^4+1$;

$D^{16}+D^{14}+D^{11}+D^6+D^4+D^3+1$;

$D^{16}+D^{15}+D^{14}+D^{13}+D^9+D^8+D^6+D^2+1$;

$D^{16}+D^{15}+D^{14}+D^{12}+D^{11}+D^{10}+D^9+D^6+D^5+D^2+1$;

$D^{16}+D^{13}+D^{11}+D^{10}+D^8+D^6+D^5+D^2+1$;

$D^{16}+D^{15}+D^9+D^6+D^4+D^2+1$;

$D^{16}+D^{15}+D^{12}+D^{10}+D^8+D^7+D^3+D^2+1$;

$D^{16}+D^{14}+D^{12}+D^{11}+D^5+D^4+D^3+D^2+1$;

$D^{16}+D^{12}+D^{10}+D^9+D^9+D^5+D^4+D^5+D^2+1$;

$D^{16}+D^{15}+D^{13}+D^{11}+D^{10}+D^9+D^5+D^4+D^3+D^2+1$;

$D^{16}+D^{11}+D^{10}+D^7+D^6+D^5+D^4+D+1$;

$D^{16}+D^{14}+D^{13}+D^{12}+D^{11}+D^{10}+D^9+D^8+D^3+D+1$;

$D^{16}+D^{15}+D^{14}+D^{12}+D^9+D^7+D^6+D^5+D^5+D+1$;

$D^{16}+D^{15}+D^{12}+D^9+D^8+D^7+D^6+D^5+D^3+D+1$;

$D^{16}+D^{15}+D^{12}+D^{11}+D^{10}+D^9+D^6+D^4+D^2+D+1$;

$D^{16}+D^{12}+D^{11}+D^{10}+D^9+D^8+D^6+D^4+D^2+D+1$; or $D^{16}+D^{15}+D^{14}+D^9+D^7+D^6+D^4+D^3+D^2+D+1$;

and performing polar encoding on the first bit sequence.

In this encoding manner, a false alarm rate (FAR) requirement can be satisfied, and normal communication can be ensured.

In a possible design, the CRC polynomial is implemented by using a shift register.

In a possible design, the L CRC bits in the first bit sequence are located after the A to-be-encoded information bits.

In a possible design, the encoding apparatus transmits the polar-encoded first bit sequence.

In a possible design, the foregoing encoding method may be implemented by using hardware, for example, a circuit, or one or more integrated circuits. The foregoing encoding method may alternatively be implemented by using software. For example, the foregoing encoding method is performed by one or more processors by reading an instruction stored in a memory. The one or more processors may be integrated in one chip, or may be distributed in a plurality of chips. The foregoing encoding method may alternatively be partially implemented by using hardware and partially implemented by using software. For example, the processor performs the step of "performing CRC encoding on A to-be-encoded information bits based on a cyclic redundancy check (CRC) polynomial" by reading the instruction stored in the memory, and the step of "performing polar encoding on the first bit sequence" is implemented by using a logical circuit or an accelerator. Certainly, a combination of the foregoing manners may be used by a person skilled in the art in a specific implementation.

In a possible design, the encoding apparatus is a base station or a terminal.

According to a second aspect, this application provides an encoding apparatus, including:

a first encoding module, configured to perform CRC encoding on A to-be-encoded information bits based on a cyclic redundancy check (CRC) polynomial, to obtain a first bit sequence, where the first bit sequence includes L CRC bits and the A information bits, and L and A are positive integers, where when L=3, the CRC polynomial is $D^3+D^2+1$;

when L=4, the CRC polynomial is any one of the following polynomials:

$D^4+1$;
$D^4+D^3+1$; or
$D^4+D^2+1$;

when L=5, the CRC polynomial is any one of the following polynomials:

$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;

when L=8, the CRC polynomial is any one of the following polynomials:

$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or when L=16, the CRC polynomial is any one of the following polynomials:

$D^{16}+D^{15}+D^{14}+D^{13}+D^{12}+D^{11}+D^8+D^7+D^6+D^4+1$;
$D^{16}+D^{14}+D^{11}+D^6+D^4+D^3+1$;
$D^{16}+D^{15}+D^{14}+D^{13}+D^9+D^8+D^6+D^2+1$;
$D^{16}+D^{15}+D^{14}+D^{12}+D^{11}+D^{10}+D^9+D^6+D^5+D^2+1$;
$D^{16}+D^{13}+D^{11}+D^{10}+D^8+D^6+D^5+D^2+1$;
$D^{16}+D^{15}+D^9+D^6+D^4+D^2+1$;
$D^{16}+D^{15}+D^{12}+D^{10}+D^8+D^7+D^3+D^2+1$;
$D^{16}+D^{14}+D^{12}+D^{11}+D^5+D^4+D^3+D^2+1$;
$D^{16}+D^{12}+D^{10}+D^9+D^5+D^4+D^3+D^2+1$;
$D^{16}+D^{15}+D^{13}+D^{11}+D^{10}+D^9+D^5+D^4+D^3+D^2+1$;
$D^{16}+D^{11}+D^{10}+D^7+D^6+D^5+D^4+D+1$;
$D^{16}+D^{14}+D^{13}+D^{12}+D^{11}+D^{10}+D^9+D^8+D^3+D+1$;
$D^{16}+D^{15}+D^{14}+D^{12}+D^9+D^7+D^6+D^5+D^5+D+1$;
$D^{16}+D^{15}+D^{12}+D^9+D^8+D^7+D^6+D^5+D^3+D+1$;
$D^{16}+D^{15}+D^{12}+D^{11}+D^{10}+D^9+D^6+D^4+D^2+D+1$;
$D^{16}+D^{12}+D^{11}+D^{10}+D^9+D^8+D^6+D^4+D^2+D+1$; or
$D^{16}+D^{15}+D^{14}+D^9+D^7+D^6+D^4+D^3+D^2+D+1$;
and a second encoding module, configured to perform polar encoding on the first bit sequence.

In a possible, the CRC polynomial is implemented by using a shift register.

In a possible design, the L CRC bits in the first bit sequence are located after the A to-be-encoded information bits.

In a possible design, the apparatus further includes a sending module, configured to send the polar-encoded first bit sequence.

In a possible design, the apparatus is a base station or a terminal.

According to a third aspect, this application provides an encoding apparatus including a processor, and the processor is configured to:

perform CRC encoding on A to-be-encoded information bits based on a cyclic redundancy check (CRC) polynomial, to obtain a first bit sequence, where the first bit sequence includes L CRC bits and the A information bits, and L and A are positive integers, where when L=3, the CRC polynomial is $D^3+D^2+1$;

when L=4, the CRC polynomial is any one of the following polynomials:

$D^4+1$;
$D^4+D^3+1$; or
$D^4+D^2+1$;

when L=5, the CRC polynomial is any one of the following polynomials:

$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;

when L=8, the CRC polynomial is any one of the following polynomials:

$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or when L=16, the CRC polynomial is any one of the following polynomials:

$D^{16}+D^{15}+D^{14}+D^{13}+D^{12}+D^{11}+D^8+D^7+D^6+D^4+1$;
$D^{16}+D^{14}+D^{11}+D^6+D^4+D^3+1$;
$D^{16}+D^{15}+D^{14}+D^{13}+D^9+D^8+D^6+D^2+1$;
$D^{16}+D^{15}+D^{14}+D^{12}+D^{11}+D^{10}+D^9+D^6+D^5+D^2+1$;
$D^{16}+D^{13}+D^{11}+D^{10}+D^8+D^6+D^5+D^2+1$;
$D^{16}+D^{15}+D^9+D^6+D^4+D^2+1$;
$D^{16}+D^{15}+D^{12}+D^{10}+D^8+D^7+D^3+D^2+1$;
$D^{16}+D^{14}+D^{12}+D^{11}+D^5+D^4+D^3+D^2+1$;
$D^{16}+D^{12}+D^{10}+D^9+D^5+D^4+D^3+D^2+1$;
$D^{16}+D^{15}+D^{13}+D^{11}+D^{10}+D^9+D^5+D^4+D^3+D^2+1$;
$D^{16}+D^{11}+D^{10}+D^7+D^6+D^5+D^4+D+1$;
$D^{16}+D^{14}+D^{13}+D^{12}+D^{11}+D^{10}+D^9+D^8+D^3+D+1$;
$D^{16}+D^{15}+D^{14}+D^{12}+D^9+D^7+D^6+D^5+D^5+D+1$;
$D^{16}+D^{15}+D^{12}+D^9+D^8+D^7+D^6+D^5+D^3+D+1$;
$D^{16}+D^{15}+D^{12}+D^{11}+D^{10}+D^9+D^6+D^4+D^2+D+1$;
$D^{16}+D^{12}+D^{11}+D^{10}+D^9+D^8+D^6+D^4+D^2+D+1$; or
$D^{16}+D^{15}+D^{14}+D^9+D^7+D^6+D^4+D^3+D^2+D+1$;
and perform polar encoding on the first bit sequence.

In a possible design, the encoding apparatus further includes a memory, and the memory is configured to store a program instruction.

In a possible design, the CRC polynomial is implemented by using a shift register.

In a possible design, the L CRC bits in the first bit sequence are located after the A to-be-encoded information bits.

In a possible design, the apparatus is a base station or a terminal.

The memory may be located inside the processor, or outside the processor. The processor may be integrated in a terminal or a base station.

The processor may be a circuit, or one or more integrated circuits or one or more special-purpose chips. The processor may alternatively be a general-purpose chip, configured to implement the encoding function when the program instruction of the encoding method is loaded to the processor. The processor may alternatively be one of or a combination of more than one of a circuit, an integrated circuit, a special-purpose chip, and a general-purpose chip.

According to a fourth aspect, this application provides an encoding apparatus, including:

an input interface, configured to obtain a to-be-encoded bit sequence;

a logical circuit, configured to perform, based on the obtained to-be-encoded bit sequence, the method provided in any one of the first aspect and the possible designs of in the first aspect, to obtain an encoded bit; and an output interface, configured to output the encoded bit.

In a possible design, the apparatus is a base station or a terminal.

According to a fifth aspect, this application provides a communications device, including an encoding apparatus provided in any one of the third aspect and the possible designs of the third aspect and a transceiver, where the transceiver is configured to send a bit encoded by the encoding apparatus.

In a possible design, the communications device is a base station or a terminal.

According to a sixth aspect, this application provides a readable storage medium, storing a computer program, and the computer program is configured to implement the encoding method provided in any one of the first aspect and the possible designs of the first aspect.

According to a seventh aspect, this application provides a program product, where the program product includes a computer program, and the computer program is stored in a readable storage medium. At least one processor of an encoding apparatus can read the computer program from the readable storage medium. The at least one processor executes the computer program, so that the encoding apparatus implements the encoding method in any one of the first aspect and the possible designs of the first aspect.

By using the CRC polynomial provided in this application, an FAR requirement of a system can be satisfied, so that normal communication can be ensured.

DESCRIPTION OF EMBODIMENTS

Figure 1A:
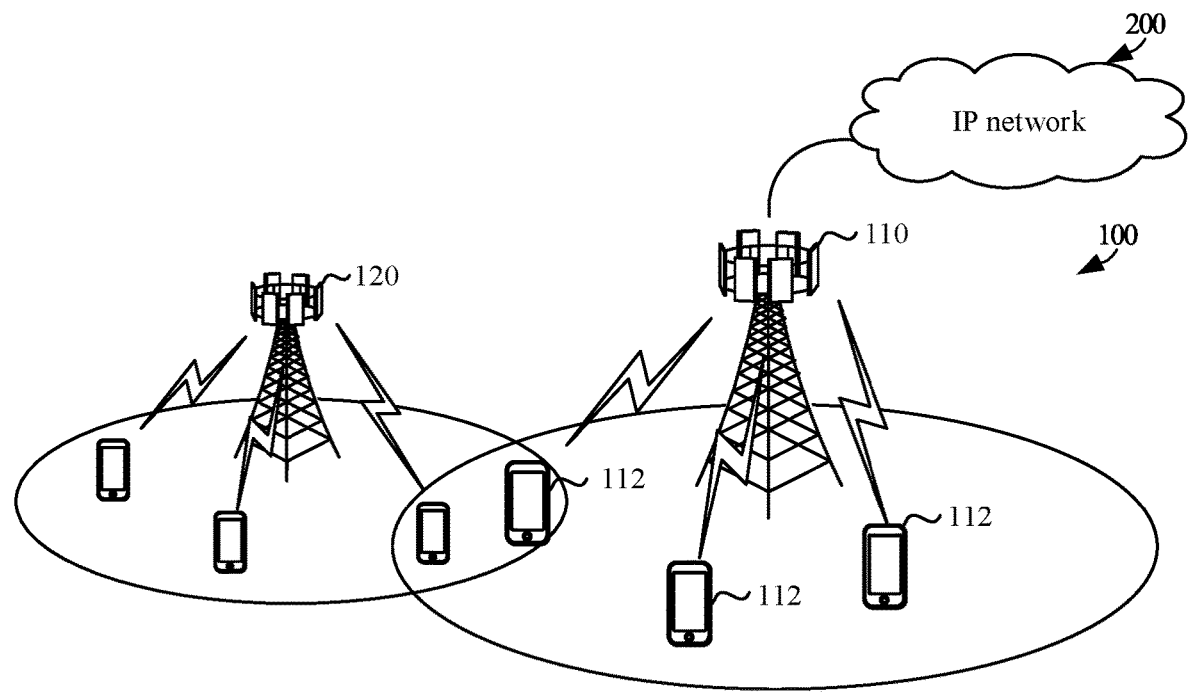
FIG. 1(a) and FIG. 1(b) are schematic architectural diagrams of a communications system to which an embodiment of this application is applicable.

A polar code is a type of linear block code, whose generator matrix is $G_N$ and encoding process is $x_1^N = u_1^N G_N$. $u_1^N = (u_1, u_2, \ldots, u_N)$ is a binary row vector, and has a length of N (namely, a code length), where $G_N = F_2^{\otimes (log_2(N))}$, and herein $$F_2 = \begin{bmatrix} 1 & 0 \\ 1 & 1 \end{bmatrix}.$$

$F_2^{\otimes(log_2(N))}$ is defined as a Kronecker product of $log_2 N$ matrices $F_2$. $x_1^N$ is an encoded bit (also referred to as a code word). The encoded bit is obtained by multiplying $u_1^N$ and the generator matrix $G_N$, and the multiplication process is the encoding process. During the encoding process of the polar code, some bits in $u_1^N$ are used to carry information, and are referred to as information bits, and an index set of the information bits is denoted as A; and some other bits in $u_1^N$ are set to fixed values that are agreed on in advance by transmit and receive ends, referred to as frozen bits, and an index set of the frozen bits is represented by a complementary set $A^c$ of A. A frozen bit is usually set to 0, and a frozen bit sequence can be arbitrarily set provided that the frozen bit sequence is agreed on in advance by the transmit and receive ends.

To further improve encoding performance of a system, an outer code with a check capability, for example, a cyclic redundancy check (CRC) code may be cascaded to a polar code. When a decoding manner such as serial cancellation list decoding is used, after the decoding is completed, survivor paths are selected based on the cyclic redundancy check to improve channel coding performance of the system. When the polar code is used to control a channel, in addition to a conventional technical indicator such as a block error rate (BLER), a false alarm rate (FAR) indicator further needs to be satisfied. For example, if a quantity of CRC bits is L, the decoding manner such as the serial cancellation list decoding is used, and after the decoding is completed, the cyclic redundancy check is used to check T paths in the survivor paths, and then the FAR is usually required to be lower than $(2^{\wedge}(-L+log_2(T)))$. It is noted that, selection of a value of T does not depend on a cyclic redundancy check polynomial and a length thereof, but depends on a complexity of decoding implementation, decoding performance, and the like. In this way, it is necessary to consider how to find a suitable manner of cascading the CRC check code and the polar code based on an FAR requirement. This application focuses on determining, based on the value of L, an approximate CRC polynomial to satisfy requirements of the system, thereby ensuring normal communication.

The embodiments of this application may be applied to a wireless communications system. It should be noted that, the wireless communications system mentioned in the embodiments of this application includes but is not limited to: a long term evolution system (LTE) and three application scenarios of a next-generation 5G mobile communications system: enhanced mobile broad band (eMBB), URLLC, and massive machine-type communications (mMTC). Alternatively, the wireless communications system may be a device to device (D2D) terminal communications system, another communications system, a future communications system, or the like.

The communications apparatus in this application may be configured in a communications device, and the communications device mainly includes a network device or a terminal device. If a transmit end in this application is a network device, a receive end is a terminal device; or if a transmit end in this application is a terminal device, a receive end is a network device.

In the embodiments of this application, as shown in FIG. 1(a), a communications system 100 includes a network device 110 and a terminal 112. When a wireless communication network 100 includes a core network, the network device 110 may also be connected to the core network. The network device 110 may further communicate with an IP network 200, for example, Internet, a private IP network, or other data networks. The network device provides services for a terminal within coverage. For example, referring to FIG. 1(a), the network device 110 provides radio access for one or more terminals within the coverage of the network device 110. In addition, coverage of network devices, for example, the network device 110 and a network device 120, may have an overlapping area. The network devices may further communicate with each other. For example, the network device 110 may communicate with the network device 120.

Figure 1B:
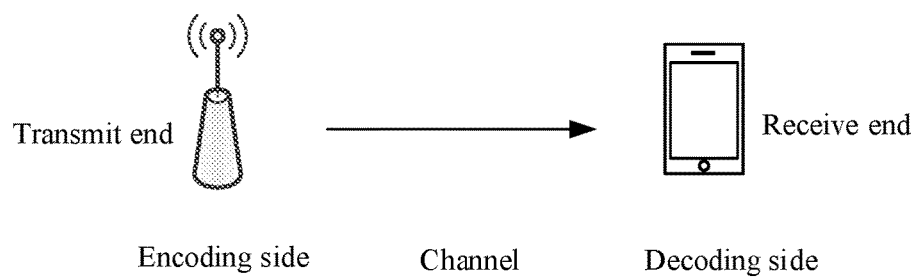

Because the network device 110 or the terminal 112 can use the encoding method described in the embodiments of this application to send information or data, for ease of describing, the communications system 100 in the embodiments of this application is simplified to be a system including a transmit end 101 and a receive end 102 as shown in FIG. 1(b). The transmit end 101 may be the network device 110, and the receive end 102 is the terminal 112; or the transmit end 101 is the terminal 112, and the receive end 102 is the network device 110. The network device 110 may be a device configured to communicate with a terminal device, for example, an evolved nodeB (eNB or eNodeB) in an LTE system, a network side device in a 5G network, a network side device communicating with the terminal in other networks, or a network side device in a future network. Alternatively, the network device may be a relay station, an access point, an in-vehicle device, or the like. In a device to device (D2D) communications system, the network device may be a terminal serving as a base station. The terminal may include various handheld devices, in-vehicle devices, wearable devices, computing devices that have a wireless communication function, or other processing devices connected to a radio modem, and various forms of user equipment (UE), mobile stations (MS), and the like.

The encoding process in this application generally includes: performing a CRC check on to-be-encoded information, and if necessary, performing interleaving on the CRC-checked bit sequence, and then performing polar code encoding. In addition, based on a target code length M, the encoding bit encoded by the polar code may further be subjected but not limited to one or more of rate matching, modulation, digital-to-analog conversion, frequency conversion, and the like.

Figure 2:
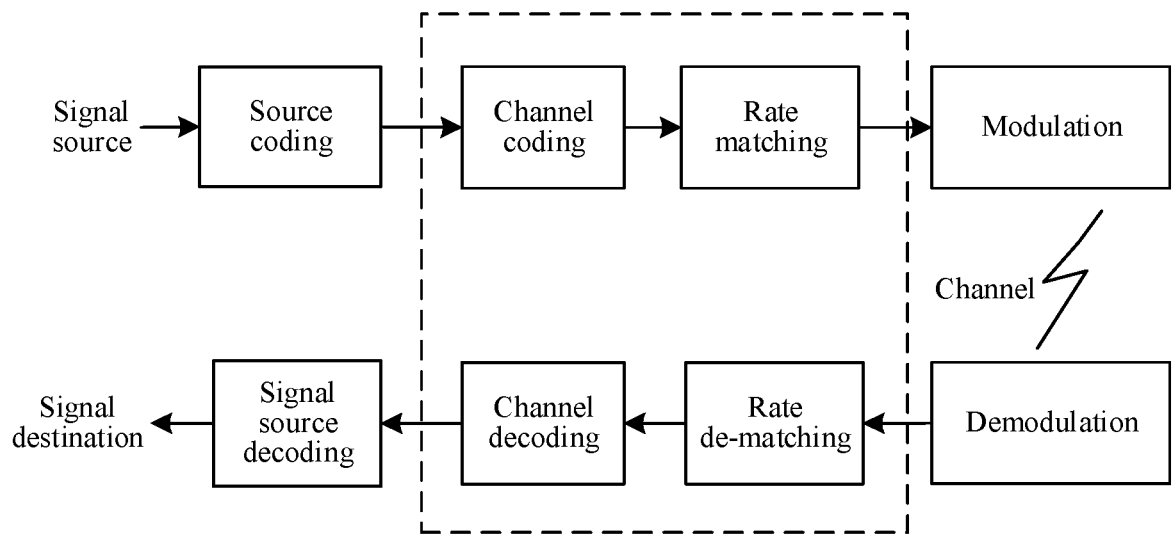
FIG. 2 is a schematic flowchart of a communications system.

FIG. 2 is a schematic flowchart of a communications system, as shown in FIG. 2, at a transmit end, a signal source is sent after source coding, channel coding, rate matching (an optional step), and modulation sequentially. At a receive end, the signal source is output to a signal destination after demodulation, rate de-matching (an optional step), channel decoding, and signal source decoding sequentially. This embodiment of this application mainly relates to channel coding and channel decoding (referred to as channel coding and decoding for short), which will be introduced by using specific examples below. The channel coding and decoding in this embodiment of this application may use a polar code cascaded to a CRC check code.

This application provides an encoding method and apparatus to satisfy an FAR requirement. The method and the apparatus in this application are applicable to both a control channel and a data channel, and applicable to both an uplink and a downlink. The encoding method and apparatus provided in this application are described in detail in the following with reference to the accompanying drawings.

Figure 3:
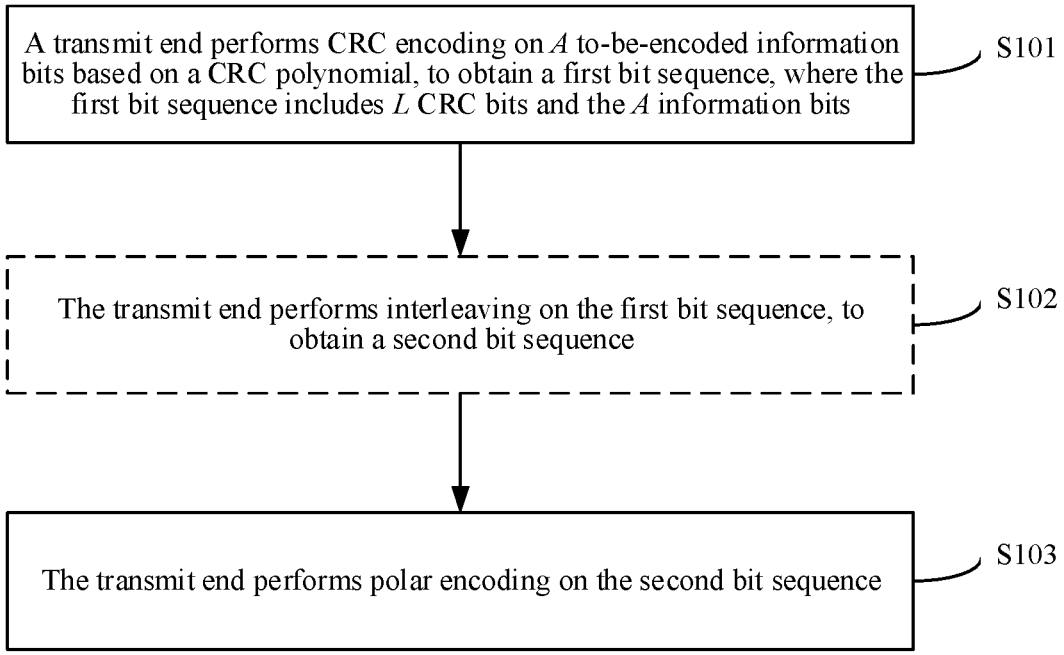
FIG. 3 is a flowchart of an embodiment of an encoding method according to this application.

FIG. 3 is a flowchart of an embodiment of an encoding method according to this application. As shown in FIG. 3, an execution body of this embodiment is a transmit end, and the method in this embodiment may include the following steps.

S101. A transmit end performs CRC encoding on A to-be-encoded information bits based on a CRC polynomial, to obtain a first bit sequence, where the first bit sequence includes L CRC bits and the A information bits, and L and A are positive integers. L is often referred to as a CRC length.

Considering the FAR requirement, when L=3, the CRC polynomial is $D^3+D^2+1$;

when L=4, the CRC polynomial is any one of the following polynomials:

$D^4+1$;
$D^4+D^3+1$; or
$D^4+D^2+1$;

when L=5, the CRC polynomial is any one of the following polynomials:

$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;

when L=8, the CRC polynomial is any one of the following polynomials:

$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or when L=16, the CRC polynomial is any one of the following polynomials:
$D^{16}+D^{15}+D^{14}+D^{13}+D^{12}+D^{11}+D^8+D^7+D^6+D^4+1$;
$D^{16}+D^{14}+D^{11}+D^6+D^4+D^3+1$;
$D^{16}+D^{15}+D^{14}+D^{13}+D^9+D^8+D^6+D^2+1$;
$D^{16}+D^{15}+D^{14}+D^{12}+D^{11}+D^{10}+D^9+D^6+D^5+D^2+1$;
$D^{16}+D^{13}+D^{11}+D^{10}+D^8+D^6+D^5+D^2+1$;
$D^{16}+D^{15}+D^9+D^6+D^4+D^2+1$;
$D^{16}+D^{15}+D^{12}+D^{10}+D^8+D^7+D^3+D^2+1$;
$D^{16}+D^{14}+D^{12}+D^{11}+D^5+D^4+D^3+D^2+1$;
$D^{16}+D^{12}+D^{10}+D^9+D^5+D^4+D^3+D^2+1$;
$D^{16}+D^{15}+D^{13}+D^{11}+D^{10}+D^9+D^5+D^4+D^5+D^2+1$;
$D^{16}+D^{11}+D^{10}+D^7+D^6+D^5+D^4+D+1$;
$D^{16}+D^{14}+D^{13}+D^{12}+D^{11}+D^{10}+D^9+D^8+D^3+D+1$;
$D^{16}+D^{15}+D^{14}+D^{12}+D^9+D^7+D^6+D^5+D^5+D+1$;
$D^{16}+D^{15}+D^{12}+D^9+D^8+D^7+D^6+D^5+D^3+D+1$;
$D^{16}+D^{15}+D^{12}+D^{11}+D^{10}+D^9+D^6+D^4+D^2+D+1$;
$D^{16}+D^{12}+D^{11}+D^{10}+D^9+D^8+D^6+D^4+D^2+1$; or
$D^{16}+D^{15}+D^{14}+D^9+D^7+D^6+D^4+D^3+D^2+D+1$.

A specific process of performing CRC encoding based on a selected polynomial is not different from existing commonly-used CRC encoding.

Specifically, after receiving the A to-be-encoded information bits, the transmit end adds the L CRC bits based on the CRC polynomial, to obtain the first bit sequence.

The A to-be-encoded information bits may be obtained by arranging to-be-sent information bits in order or in reverse order, or may be obtained after performing other processing on the information bits. This is not limited herein.

Figure 4:
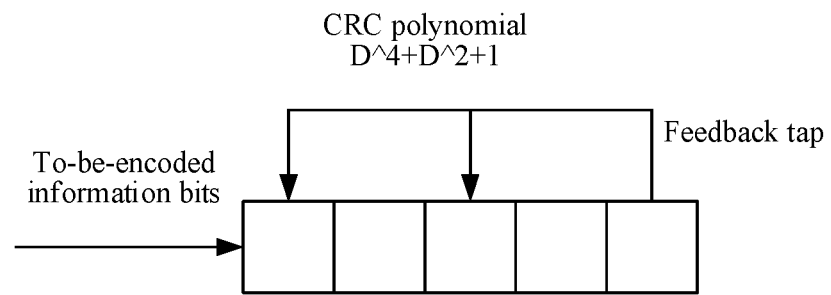
FIG. 4 is a schematic diagram of a CRC encoding manner.

An implementation of CRC encoding is a form of a shift register. For example, FIG. 4 shows a commonly used manner of implementing CRC encoding in a form of a shift register (a register for short). A feedback tap of the register is determined based on a CRC polynomial $D^4+D^2+1$, and register content is initialized as a preset value. During encoding, the to-be-encoded information bits are shifted from one side to the register bit by bit, and a bit exclusive OR operation is performed on the feedback tap and a corresponding state of the register, so that the state of the register changes. After all to-be-encoded bits are shifted to the register, bits 0 having a length equal to a CRC length are also shifted to the register, the state of the register is read, and the state of the register is used as a CRC bit and as a code word for CRC encoding. The L CRC bits in the first bit sequence may be located after the A to-be-encoded information bits, or may be located before the A to-be-encoded information bits, or at any location agreed on by the transmit and receive ends.

S102. The transmit end performs interleaving on the first bit sequence, to obtain a second bit sequence.

The interleaving step may be performed on some bits in the first bit sequence, or may be performed on all bits in the first bit sequence. It should be noted that, this step is an optional step, and only when locations of information bits and/or CRC check bits need to be adjusted, this step is necessary; and if unnecessary, this step can be omitted in an actual encoding process. In this case, the second bit sequence in the step S103 is the first bit sequence. A specific interleaving solution is not content of this application, and details are not described herein again.

S103. The transmit end performs polar encoding on the second bit sequence, to obtain a third bit sequence. When step S102 is omitted, this step is that the transmit end performs polar encoding on the first bit sequence, to obtain a third bit sequence.

An existing polar encoding method can be used by the transmit end to perform polar encoding on the second bit sequence. Details are not described herein again.

In S104 (no shown), the transmit end sends the third bit sequence after performing some or all of the steps, including but not limited to, rate matching, modulation, analog-to-digital conversion, and frequency conversion.

It should be noted that, the rate matching step in step S104 is optional. If an encoding code length is the same as a code length of a target code, the rate matching is not needed. Because this embodiment of the present disclosure does not focus on step S104, details are not described herein again. For example, in a possible implementation, a person skilled in the art can also refer to practices in the prior art.

In the encoding method according to this embodiment, the transmit end performs CRC encoding on the A to-be-encoded information bits based on the CRC polynomial in this application, to obtain the first bit sequence, and performs interleaving (if necessary) and polar encoding on the first bit sequence, so that after the polar code is cascaded to the CRC code, an FAR requirement can be satisfied in the used polar encoding manner.

It should be noted that after a receive end (a decoding side) receives to-be-decoded information bits, the receive end also needs to perform a CRC check based on the same CRC polynomial. Details are not described herein again.

In this embodiment of this application, a decoding operation on the decoding side generally includes: receiving a to-be-decoded sequence, and performing polar code decoding on the obtained to-be-decoded sequence based on a CRC polynomial.

Figure 5:
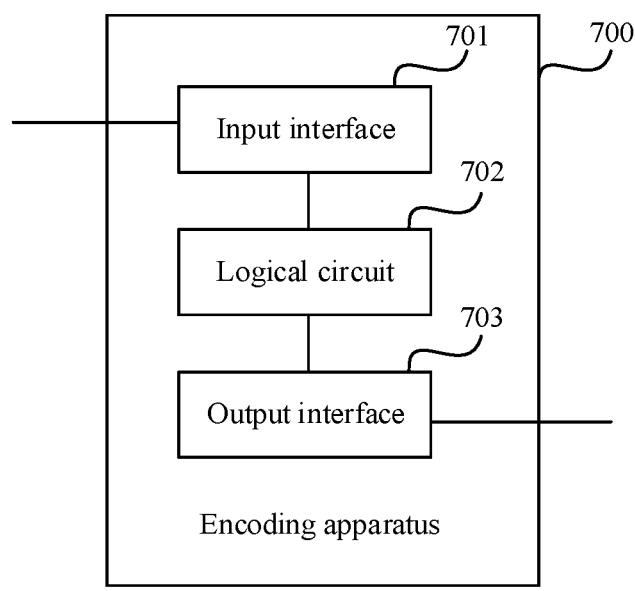
FIG. 5 is a schematic structural diagram 1 of an encoding apparatus according to an embodiment of this application.

Based on a same inventive concept of the encoding method shown in FIG. 3, as shown in FIG. 5, an embodiment of this application further provides an encoding apparatus 700, and the encoding apparatus 700 is configured to perform the encoding method shown in FIG. 3. The encoding method shown in FIG. 3 may be partially or fully implemented by using hardware or software. When implemented by using hardware, the encoding apparatus 700 includes: an input interface 701, configured to obtain a to-be-encoded bit sequence; a logical circuit 702, configured to perform the encoding method shown in FIG. 3, where for details, refer to the description of the foregoing method embodiments, and details are not described herein again; and an output interface 703, configured to output an encoded bit sequence.

Optionally, the encoding apparatus 700 may be a chip or an integrated circuit in a specific implementation.

Figure 6:
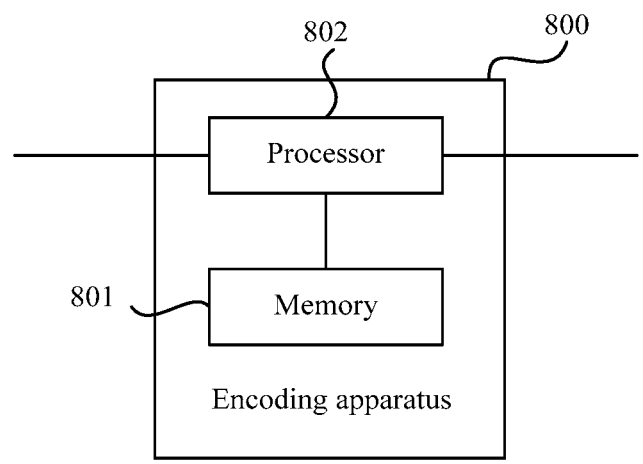
FIG. 6 is a schematic structural diagram 2 of an encoding apparatus according to an embodiment of this application.

Optionally, when the encoding method in the foregoing embodiment is partially or fully implemented by using software, as shown in FIG. 6, an encoding apparatus 800 includes: a memory 801, configured to store a program; and a processor 802, configured to execute the program stored in the memory 801. When the program is executed, the encoding apparatus 800 can implement the encoding method provided in the embodiment of FIG. 3.

Optionally, the memory 801 may be a physically independent unit, or may be integrated with the processor 802.

Optionally, when the encoding method shown in the embodiment of FIG. 3 is partially or fully implemented by using software, the encoding apparatus 800 may include only the processor 802. The memory 801 configured to store the program is located outside the encoding apparatus 800. The processor 802 is connected to the memory 801 by using a circuit/a cable, and configured to read and execute the program stored in the memory 801.

The processor 802 may be a central processing unit (CPU), a network processor (NP), or a combination of a CPU and an NP.

The processor 802 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 801 may include a volatile memory, for example, a random access memory (RAM). The memory 801 may also include a non-volatile memory, for example, a flash memory, a hard disk drive (HDD), or a solid-state drive (SSD). The memory 801 may also include a combination of the foregoing types of memories.

Figure 7:
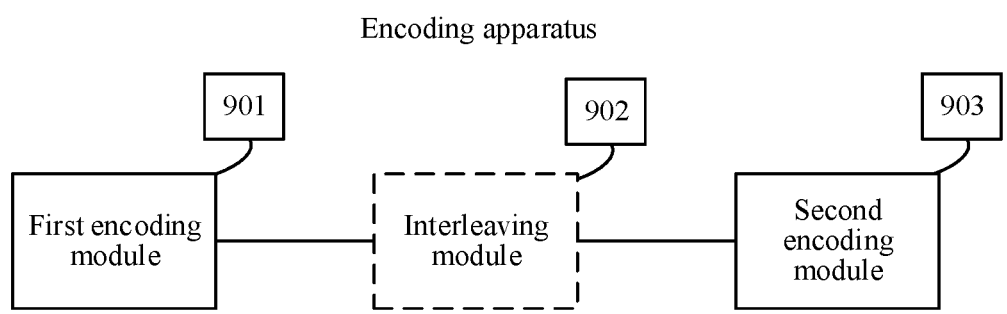
FIG. 7 is a schematic structural diagram 3 of an encoding apparatus according to an embodiment of this application.

Based on a same inventive concept of the encoding method shown in FIG. 3, as shown in FIG. 7, an embodiment of this application further provides a schematic structural diagram of an embodiment of an encoding apparatus, and the apparatus may include: a first encoding module 901, an interleaving module 902, and a second encoding module 903. The first encoding module 901 is configured to perform cyclic redundancy check CRC encoding on A to-be-encoded information bits base on a CRC polynomial, to obtain a first bit sequence, and the first bit sequence includes L CRC bits and the A information bits, and L and A are positive integers.

When L=3, the CRC polynomial is $D^3+D^2+1$;

when L=4, the CRC polynomial is any one of the following polynomials:

$D^4+1$;
$D^4+D^3+1$; or
$D^4+D^2+1$;

when L=5, the CRC polynomial is any one of the following polynomials:

$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;

when L=8, the CRC polynomial is any one of the following polynomials:

$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or when L=16, the CRC polynomial is any one of the following polynomials:

$D^{16}+D^{15}+D^{14}+D^{13}+D^{12}+D^{11}+D^8+D^7+D^6+D^4+1$;

$D^{16}+D^{14}+D^{11}+D^6+D^4+D^3+1$;

$D^{16}+D^{15}+D^{14}+D^{13}+D^9+D^8+D^6+D^2+1$;

$D^{16}+D^{15}+D^{14}+D^{12}+D^{11}+D^{10}+D^9+D^6+D^5+D^2+1$;

$D^{16}+D^{13}+D^{11}+D^{10}+D^8+D^6+D^5+D^2+1$;

$D^{16}+D^{15}+D^9+D^6+D^4+D^2+1$;

$D^{16}+D^{15}+D^{12}+D^{10}+D^8+D^7+D^5+D^2+1$;

$D^{16}+D^{14}+D^{12}+D^{11}+D^5+D^4+D^3+D^2+1$;

$D^{16}+D^{12}+D^{10}+D^9+D^5+D^4+D^3+D^2+1$;

$D^{16}+D^{15}+D^{13}+D^{11}+D^{10}+D^9+D^5+D^4+D^3+D^2+1$;

$D^{16}+D^{11}+D^{10}+D^7+D^6+D^5+D^4+D+1$;

$D^{16}+D^{14}+D^{13}+D^{12}+D^{11}+D^{10}+D^9+D^8+D^3+D+1$;

$D^{16}+D^{15}+D^{14}+D^{12}+D^9+D^7+D^6+D^5+D^5+D+1$;

$D^{16}+D^{15}+D^{12}+D^9+D^8+D^7+D^6+D^5+D^3+D+1$;

$D^{16}+D^{15}+D^{12}+D^{11}+D^{10}+D^9+D^6+D^4+D^2+D+1$;

$D^{16}+D^{12}+D^{11}+D^{10}+D^9+D^8+D^6+D^4+D^2+D+1$; or $D^{16}+D^{15}+D^{14}+D^9+D^7+D^6+D^4+D^3+D^2+D+1$.

Generally, the CRC polynomial used for CRC encoding is implemented by using a shift register. The L CRC bits in the first bit sequence may be located after the A to-be-encoded information bits, or and may be located before the A to-be-encoded information bits, or at any location agreed on by the transmit and receive ends. The interleaving module 902 is an optional module, configured to perform interleaving on the first bit sequence to obtain a second bit sequence. The module is necessary only when a manner such as distributed CRC is needed and locations of information bits and/or CRC check bits need to be adjusted. If there is no such a need, the module can be omitted in an actual encoding process. In this case, the second bit sequence is the first bit sequence. A second encoding module 903 is configured to perform polar encoding on the second bit sequence. When there is no interleaving module 902, the second encoding module 903 is configured to perform polar encoding on the first bit sequence.

It should be noted that, modules such as a rate matching module, a modulation module, and a sending module are not drawn in FIG. 7. The sending module is configured to send an encoded sequence. Certainly, before the encoded sequence is sent, operations such as rate matching (if necessary) and modulation need to be performed.

Figure 8:
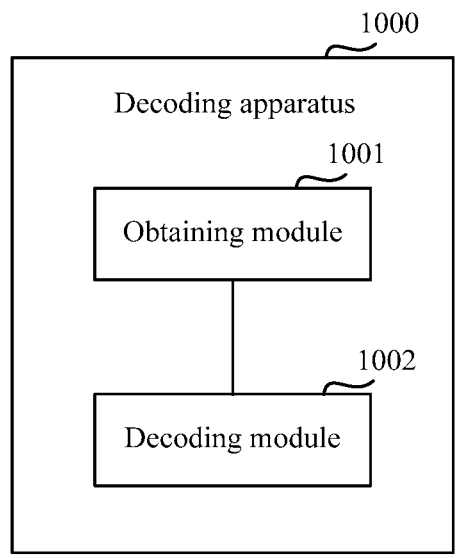
FIG. 8 is a schematic structural diagram 1 of a decoding apparatus according to an embodiment of this application.

Based on a same inventive concept of the encoding method in the foregoing embodiments, as shown in FIG. 8, an embodiment of this application further provides a decoding apparatus 1000, the decoding apparatus 1000 may be configured to perform the decoding method provided in the embodiments of this application, and the decoding apparatus 1000 includes:

an obtaining module 1001, configured to obtain a to-be-decoded bit sequence; and a decoding module 1002, configured to decode the to-be-decoded bit sequence according to the decoding method, and the decoding method is determined based on a CRC polynomial and a polar encoding method.

Figure 9:
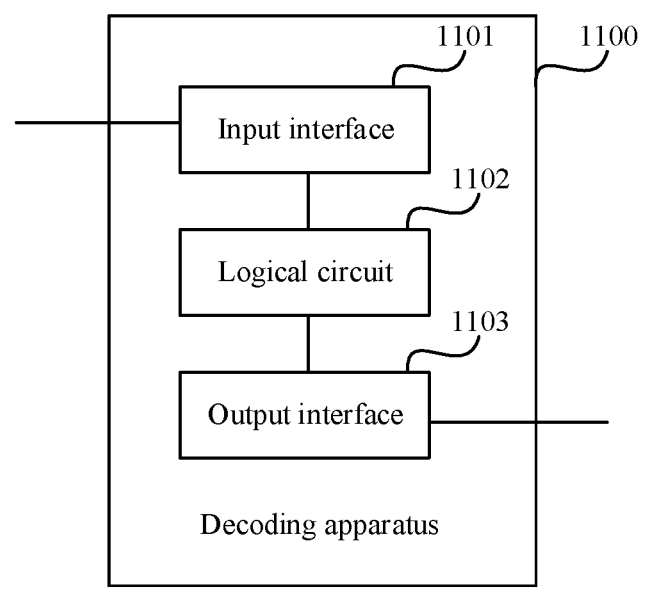
FIG. 9 is a schematic structural diagram 2 of a decoding apparatus according to an embodiment of this application.

Based on a same inventive concept of the decoding method in the foregoing embodiments, as shown in FIG. 9, an embodiment of this application further provides a decoding apparatus 1100, the decoding apparatus 1100 is configured to perform the decoding method. The decoding method may be partially or fully implemented by using hardware or software. When implemented by using hardware, the decoding apparatus 1100 includes: an input interface 1101, configured to obtain a to-be-decoded bit sequence; a logical circuit 1102, configured to perform the decoding method; and an output interface 1103, configured to output a decoded sequence.

Optionally, the decoding apparatus 1100 may be a chip or an integrated circuit in a specific implementation.

Figure 10:
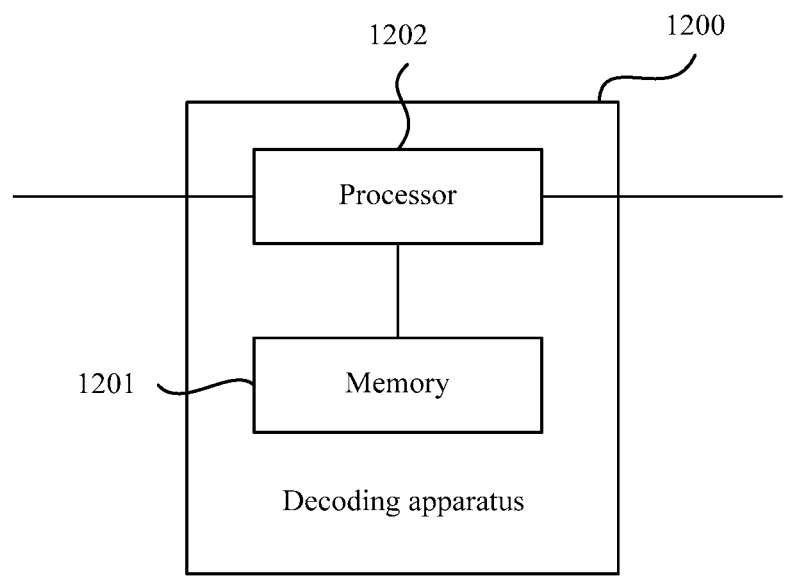
FIG. 10 is a schematic structural diagram 3 of a decoding apparatus according to an embodiment of this application.

Optionally, when the decoding method in the foregoing embodiments is partially or fully implemented by using software, as shown in FIG. 10, a decoding apparatus 1200 includes: a memory 1201, configured to store a program; a processor 1202, configured to execute the program stored in the memory 1201. When the program is executed, the decoding apparatus 1200 can implement the decoding method provided in the foregoing embodiments.

Optionally, the memory 1201 may be a physically independent unit, or may be integrated with the processor 1202.

Optionally, when the decoding method shown in the foregoing embodiments is implemented by using software, the decoding apparatus 1200 may include only the processor 1202. The memory 1201 configured to store the program is located outside the decoding apparatus 1200. The processor 1202 is connected to the memory 1201 by using a circuit/a cable, and configured to read and execute the program stored in the memory 1201.

The processor 1202 may be a central processing unit (CPU), a network processor (NP), or a combination of a CPU and an NP.

The processor 1202 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1201 may include a volatile memory, for example, a random access memory (RAM). The memory 1201 may also include a non-volatile memory, for example, a flash memory, a hard disk drive (HDD), or a solid-state drive (SSD). The memory 1201 may further include a combination of the foregoing types of memories.

Figure 11:
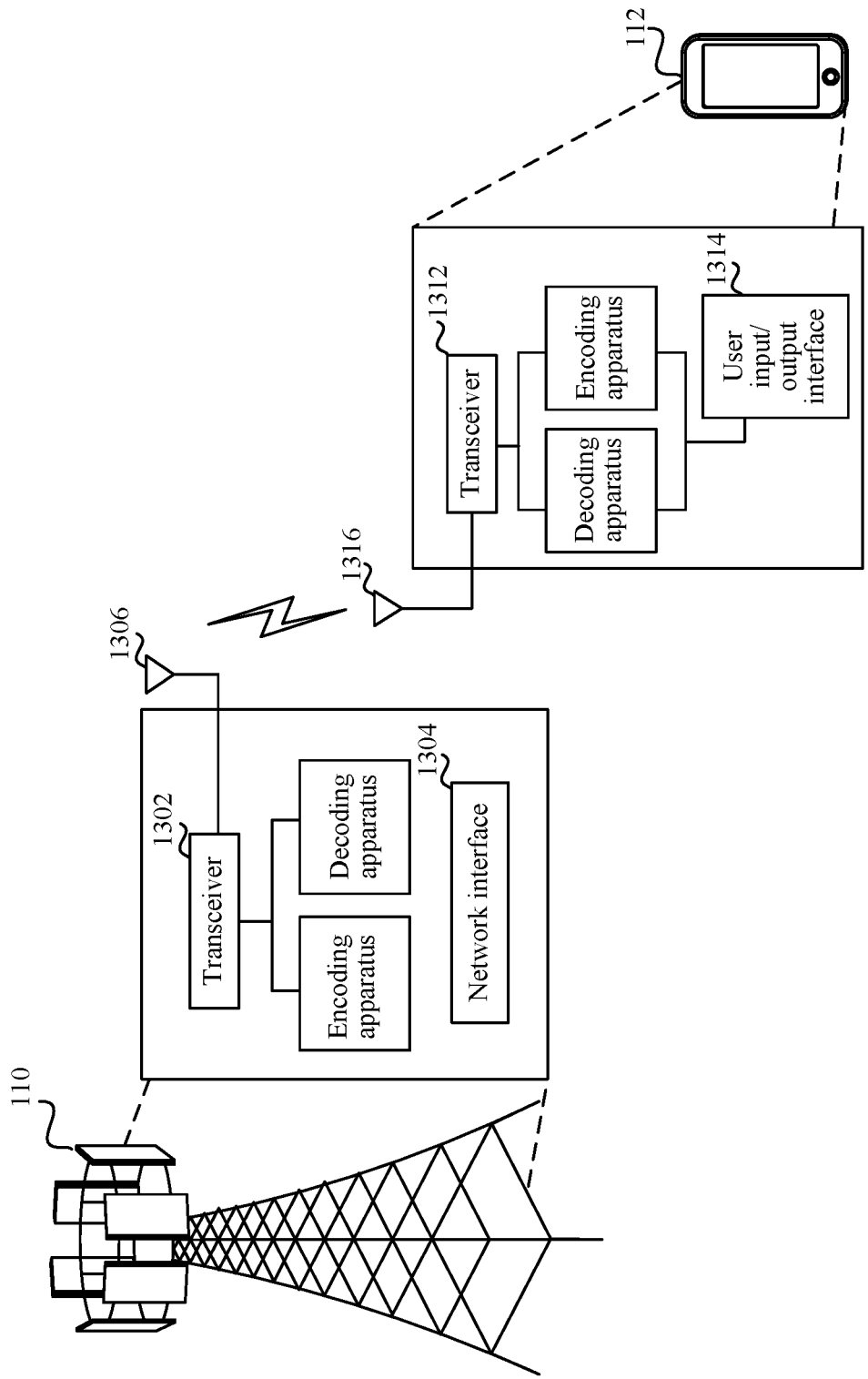
FIG. 11 is a schematic structural diagram of a network device and a terminal according to an embodiment of this application.

An embodiment of this application further provides a network device. Referring to FIG. 11, the encoding apparatus and/or the decoding apparatus described above may be installed in the network device 110. In addition to the encoding apparatus and the decoding apparatus described above, the network device 110 may further include a transceiver 1302. A bit sequence encoded by the encoding apparatus is sent to a terminal 112 by using the transceiver 1302 after subsequent changes or processing, or the transceiver 1302 is further configured to receive information/data from the terminal 112, the information/data is converted into a to-be-decoded sequence after a series of processing, and the to-be-decoded sequence is processed by the decoding apparatus to obtain a decoded sequence. The network device 110 may further include a network interface 1304, configured to communicate with other network devices.

Similarly, the encoding apparatus and/or the decoding apparatus may be configured in the terminal 112. In addition to the encoding apparatus and/or the decoding apparatus, the terminal 112 may further include a transceiver 1312. The bit sequence encoded by the encoding apparatus is sent by the transceiver 1312 to the network device 110 after subsequent changes or processing (including but not limited to some or all of rate matching, modulation, digital-to-analog conversion, and frequency conversion), or the transceiver 1312 is further configured to receive information/data from the network device 110. The information/data is converted into a to-be-decoded sequence after a series of processing (including but not limited to some or all of frequency conversion, digital-to-analog conversion, demodulation, and rate de-matching), and a decoded sequence is obtained after being processed by the decoding apparatus. The terminal 112 may further include an input/output interface 1314, configured to receive information input by a user. Information that needs to be sent to the network device 110 needs to be processed by an encoder and then sent to the network device 110 by using the transceiver 1312. Data that has been decoded by a decoder may also be presented to the user by using input/output interface 1314 after subsequent processing.

An embodiment of this application further provides a computer storage medium storing a computer program. The computer program is configured to execute the encoding method shown in FIG. 3 and the foregoing embodiments and the decoding method provided in the foregoing embodiments.

An embodiment of this application further provides a polar code encoding apparatus, including the encoding apparatus in any one of FIG. 5 to FIG. 7, and the decoding apparatus in any one of FIG. 8 to FIG. 10.

An embodiment of this application further provides a computer program product including an instruction, and when the computer program product is run on a computer, the computer is enabled to perform the encoding method shown in FIG. 3 and the decoding method provided in the foregoing embodiments.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the embodiments and all changes and modifications falling within the scope of this application.

Apparently, persons skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. An encoding method, comprising:
performing, by an encoding apparatus, cyclic redundancy check (CRC) encoding on A to-be-encoded information bits based on a CRC polynomial to obtain a CRC-encoded bit sequence, wherein the CRC-encoded bit sequence comprises L CRC bits and the A to-be-encoded information bits, and L and A are positive integers, wherein
when L=3, the CRC polynomial is $D^3+D^2+1$;
when L=4, the CRC polynomial is any one of the following polynomials:
$D^4+1$;
$D^4+D^3+1$; or
$D^4+D^2+1$;

when L=5, the CRC polynomial is any one of the following polynomials:
$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;
when L=8, the CRC polynomial is any one of the following polynomials:
$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or
when L=16, the CRC polynomial is any one of the following polynomials:
$D^{16}+D^{15}+D^{14}+D^{13}+D^{12}+D^{11}+D^8+D^7+D^6+D^4+1$;
$D^{16}+D^{14}+D^{11}+D^6+D^4+D^3+1$;
$D^{16}+D^{15}+D^{14}+D^{13}+D^9+D^8+D^6+D^2+1$;
$D^{16}+D^{15}+D^{14}+D^{12}+D^{11}+D^{10}+D^9+D^6+D^5+D^2+1$;
$D^{16}+D^{13}+D^{11}+D^{10}+D^8+D^6+D^5+D^2+1$;
$D^{16}+D^{15}+D^9+D^6+D^4+D^2+1$;
$D^{16}+D^{15}+D^{12}+D^{10}+D^8+D^7+D^3+D^2+1$;
$D^{16}+D^{14}+D^{12}+D^{11}+D^5+D^4+D^3+D^2+1$;
$D^{16}+D^{12}+D^{10}+D^9+D^5+D^4+D^3+D^2+1$;
$D^{16}+D^{15}+D^{13}+D^{11}+D^{10}+D^9+D^5+D^4+D^3+D^2+1$;
$D^{16}+D^{11}+D^{10}+D^7+D^6+D^5+D^4+D+1$;
$D^{16}+D^{14}+D^{13}+D^{12}+D^{11}+D^{10}+D^9+D^8+D^3+D+1$;
$D^{16}+D^{15}+D^{14}+D^{12}+D^9+D^7+D^6+D^5+D^3+D+1$;
$D^{16}+D^{15}+D^{12}+D^9+D^8+D^7+D^6+D^5+D^3+D+1$;
$D^{16}+D^{15}+D^{12}+D^{11}+D^{10}+D^9+D^6+D^4+D^2+D+1$;
$D^{16}+D^{12}+D^{11}+D^{10}+D^9+D^8+D^6+D^4+D^2+D+1$; or
$D^{16}+D^{15}+D^{14}+D^9+D^7+D^6+D^4+D^3+D^2+D+1$; and
performing, by the encoding apparatus, polar encoding on the CRC-encoded bit sequence to obtain a polar-encoded bit sequence.

2. The method according to claim 1, wherein the CRC polynomial is implemented by using a shift register.

3. The method according to claim 1, wherein the L CRC bits in the CRC-encoded bit sequence are located after the A to-be-encoded information bits.

4. The method according to claim 1, wherein the method further comprises:
transmitting, by the encoding apparatus, the polar-encoded bit sequence.

5. The method according to claim 4, wherein the encoding apparatus performs rate matching on the polar-encoded bit sequence based on a target code length before transmitting the polar-encoded bit sequence.

6. The method according to claim 1, wherein the encoding apparatus is a base station or a terminal.

7. An encoding apparatus, comprising at least one processor, wherein the at least one processor is configured to:
perform cyclic redundancy check (CRC) encoding on A to-be-encoded information bits based on a CRC polynomial to obtain a CRC-encoded bit sequence, wherein the CRC-encoded bit sequence comprises L CRC bits and the A to-be-encoded information bits, and L and A are positive integers, wherein when L=3, the CRC polynomial is $D^3+D^2+1$;
when L=4, the CRC polynomial is any one of the following polynomials:
$D^4+1$;
$D^4+D^3+1$; or
$D^4+D^2+1$;
when L=5, the CRC polynomial is any one of the following polynomials:
$D^5+D^4+1$;
$D^5+D^3+1$;
$D^5+D+1$;
$D^5+D^4+D^3+D+1$;
$D^5+D^4+D^2+D+1$; or
$D^5+D^3+D^2+D+1$;
when L=8, the CRC polynomial is any one of the following polynomials:
$D^8+D^6+D^5+D^3+1$;
$D^8+D^7+D^6+D^5+D^3+D^2+1$;
$D^8+D^5+D^4+D+1$;
$D^8+D^7+D^2+D+1$; or
$D^8+D^7+D^6+D^5+D^2+D+1$; or
when L=16, the CRC polynomial is any one of the following polynomials:
$D^{16}+D^{15}+D^{14}+D^{13}+D^{12}+D^{11}+D^8+D^7+D^6+D^4+1$;
$D^{16}+D^{14}+D^{11}+D^6+D^4+D^3+1$;
$D^{16}+D^{15}+D^{14}+D^{13}+D^9+D^8+D^6+D^2+1$;
$D^{16}+D^{15}+D^{14}+D^{12}+D^{11}+D^{10}+D^9+D^6+D^5+D^2+1$;
$D^{16}+D^{13}+D^{11}+D^{10}+D^8+D^6+D^5+D^2+1$;
$D^{16}+D^{15}+D^9+D^6+D^4+D^2+1$;
$D^{16}+D^{15}+D^{12}+D^{10}+D^8+D^7+D^3+D^2+1$;
$D^{16}+D^{14}+D^{12}+D^{11}+D^5+D^4+D^3+D^2+1$;
$D^{16}+D^{12}+D^{10}+D^9+D^5+D^4+D^3+D^2+1$;
$D^{16}+D^{15}+D^{13}+D^{11}+D^{10}+D^9+D^5+D^4+D^3+D^2+1$;
$D^{16}+D^{11}+D^{10}+D^7+D^6+D^5+D^4+D+1$;
$D^{16}+D^{14}+D^{13}+D^{12}+D^{11}+D^{10}+D^9+D^8+D^3+D+1$;
$D^{16}+D^{15}+D^{14}+D^{12}+D^9+D^7+D^6+D^5+D^3+D+1$;
$D^{16}+D^{15}+D^{12}+D^9+D^8+D^7+D^6+D^5+D^3+D+1$;
$D^{16}+D^{15}+D^{12}+D^{11}+D^{10}+D^9+D^6+D^4+D^2+D+1$;
$D^{16}+D^{12}+D^{11}+D^{10}+D^9+D^8+D^6+D^4+D^2+D+1$; or
$D^{16}+D^{15}+D^{14}+D^9+D^7+D^6+D^4+D^3+D^2+D+1$; and
perform polar encoding on the CRC-encoded bit sequence to obtain a polar-encoded bit sequence.

8. The apparatus according to claim 7, wherein the encoding apparatus further comprises at least one non-transitory memory, and the at least one non-transitory memory is configured to store a program instruction.

9. The apparatus according to claim 7, wherein the CRC polynomial is implemented by using a shift register.

10. The apparatus according to claim 7, wherein the L CRC bits in the CRC-encoded bit sequence are located after the A to-be-encoded information bits.

11. The apparatus according to claim 7, wherein the processor is further configured to perform rate matching on the polar-encoded bit sequence based on a target code length.

12. The apparatus according to claim 7, wherein the apparatus is a base station or a terminal.

13. A computer-readable storage medium, wherein the storage medium is configured to store a computer program, and when run by an encoding apparatus, the computer program causes the encoding apparatus to:

obtain A to-be-encoded information bits;

perform cyclic redundancy check (CRC) encoding on the A to-be-encoded information bits based on a CRC polynomial to obtain a CRC-encoded bit sequence, wherein the CRC-encoded bit sequence comprises L CRC bits and the A to-be-encoded information bits, and L and A are positive integers, wherein when L=3, the CRC polynomial is $D^3+D^2+1$;

when L=4, the CRC polynomial is any one of the following polynomials:

$D^4+1$;

$D^4+D^3+1$; or $D^4+D^2+1$;

when L=5, the CRC polynomial is any one of the following polynomials:

$D^5+D^4+1$;

$D^5+D^3+1$;

$D^5+D+1$;

$D^5+D^4+D^3+D+1$;

$D^5+D^4+D^2+D+1$; or $D^5+D^3+D^2+D+1$;

when L=8, the CRC polynomial is any one of the following polynomials:

$D^8+D^6+D^5+D^3+1$;

$D^8+D^7+D^6+D^5+D^3+D^2+1$;

$D^8+D^5+D^4+D+1$;

$D^8+D^7+D^2+D+1$; or $D^8+D^7+D^6+D^5+D^2+D+1$; or when L=16, the CRC polynomial is any one of the following polynomials:

$D^{16}+D^{15}+D^{14}+D^{13}+D^{12}+D^{11}+D^8+D^7+D^6+D^4+1$;

$D^{16}+D^{14}+D^{11}+D^6+D^4+D^3+1$;

$D^{16}+D^{15}+D^{14}+D^{13}+D^9+D^8+D^6+D^2+1$;

$D^{16}+D^{15}+D^{14}+D^{12}+D^{11}+D^{10}+D^9+D^6+D^5+D^2+1$;

$D^{16}+D^{13}+D^{11}+D^{10}+D^8+D^6+D^5+D^2+1$;

$D^{16}+D^{15}+D^9+D^6+D^4+D^2+1$;

$D^{16}+D^{15}+D^{12}+D^{10}+D^8+D^7+D^3+D^2+1$;

$D^{16}+D^{14}+D^{12}+D^{11}+D^5+D^4+D^3+D^2+1$;

$D^{16}+D^{12}+D^{10}+D^9+D^5+D^4+D^3+D^2+1$;

$D^{16}+D^{15}+D^{13}+D^{11}+D^{10}+D^9+D^5+D^4+D^3+D^2+1$;

$D^{16}+D^{11}+D^{10}+D^7+D^6+D^5+D^4+D+1$;

$D^{16}+D^{14}+D^{13}+D^{12}+D^{11}+D^{10}+D^9+D^8+D^3+D+1$;

$D^{16}+D^{15}+D^{14}+D^{12}+D^9+D^7+D^6+D^5+D^3+D+1$;

$D^{16}+D^{15}+D^{12}+D^9+D^8+D^7+D^6+D^5+D^3+D+1$;

$D^{16}+D^{15}+D^{12}+D^{11}+D^{10}+D^9+D^6+D^4+D^2+D+1$;

$D^{16}+D^{12}+D^{11}+D^{10}+D^9+D^8+D^6+D^4+D^2+D+1$; or $D^{16}+D^{15}+D^{14}+D^9+D^7+D^6+D^4+D^3+D^2+D+1$; and perform polar encoding on the CRC-encoded bit sequence to obtain a polar-encoded bit sequence; and output the polar-encoded bit sequence.

14. The computer-readable storage medium according to claim 13, wherein the CRC polynomial is implemented by using a shift register.

15. The computer-readable storage medium according to claim 13, wherein the L CRC bits in the CRC-encoded bit sequence are located after the A to-be-encoded information bits.

16. The computer-readable storage medium according to claim 13, wherein the encoding apparatus is further caused to perform rate matching on the polar-encoded bit sequence based on a target code length before outputting the polar-encoded bit sequence.

* * * * *